(12) United States Patent
Lee et al.

(10) Patent No.: US 11,361,989 B2
(45) Date of Patent: Jun. 14, 2022

(54) METHOD FOR MANUFACTURING INTERCONNECT STRUCTURES INCLUDING AIR GAPS

(71) Applicant: Taiwan Semiconductor Manufacturing Co., Ltd., Hsinchu (TW)

(72) Inventors: Cheng-Chin Lee, Taipei (TW); Shao-Kuan Lee, Kaohsiung (TW); Hsin-Yen Huang, New Taipei (TW); Hai-Ching Chen, Hsinchu (TW); Shau-Lin Shue, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/788,057

(22) Filed: Feb. 11, 2020

(65) Prior Publication Data

US 2021/0249299 A1 Aug. 12, 2021

(51) Int. Cl.
*H01L 21/768* (2006.01)
*H01L 21/02* (2006.01)

(52) U.S. Cl.
CPC ...... *H01L 21/7682* (2013.01); *H01L 21/0228* (2013.01); *H01L 21/76831* (2013.01); *H01L 21/76837* (2013.01); *H01L 21/76852* (2013.01); *H01L 21/76885* (2013.01)

(58) Field of Classification Search
CPC ........... H01L 21/7682; H01L 21/76885; H01L 21/76837; H01L 21/76852
See application file for complete search history.

(56) References Cited

U.S. PATENT DOCUMENTS

| | | | |
|---|---|---|---|
| 7,422,940 B2* | 9/2008 | Schindler | H01L 21/7682 257/E21.581 |
| 7,691,712 B2* | 4/2010 | Chidambarrao | H01L 21/823864 438/275 |
| 8,828,829 B2* | 9/2014 | Joung | H01L 21/76831 438/294 |
| 9,093,455 B2 | 7/2015 | Liou et al. | |
| 9,343,356 B2 | 5/2016 | Kuo et al. | |
| 9,449,811 B2 | 9/2016 | Hsiao et al. | |
| 9,870,944 B2 | 1/2018 | Liou et al. | |
| 10,062,603 B2 | 8/2018 | Hsiao et al. | |
| 10,325,849 B2 | 6/2019 | Lee et al. | |
| 10,515,902 B2 | 12/2019 | Chiang et al. | |
| 10,957,760 B2* | 3/2021 | Kuo | H01L 21/56 |
| 2006/0216924 A1 | 9/2006 | Wu et al. | |
| 2021/0028103 A1* | 1/2021 | Huang | H01L 21/7682 |
| 2021/0043498 A1* | 2/2021 | Lai | H01L 21/7682 |
| 2021/0098389 A1* | 4/2021 | Wu | H01L 21/76837 |

* cited by examiner

*Primary Examiner* — Daniel Luke
(74) *Attorney, Agent, or Firm* — Haynes and Boone, LLP

(57) ABSTRACT

A method and structure for forming a barrier-free interconnect layer includes patterning a metal layer disposed over a substrate to form a patterned metal layer including one or more trenches. In some embodiments, the method further includes selectively depositing a barrier layer on metal surfaces of the patterned metal layer within the one or more trenches. In some examples, and after selectively depositing the barrier layer, a dielectric layer is deposited within the one or more trenches. Thereafter, the selectively deposited barrier layer may be removed to form air gaps between the patterned metal layer and the dielectric layer.

20 Claims, 8 Drawing Sheets

100

```
┌─────────────────────────────────────────┐
│ PROVIDE SUBSTRATE INCLUDING ONE OR MORE IC │
│           DEVICES 102                    │
└─────────────────────────────────────────┘
                    ↓
┌─────────────────────────────────────────┐
│   FORM A METAL LAYER AS PART OF AN       │
│      INTERCONNECT NETWORK 104            │
└─────────────────────────────────────────┘
                    ↓
┌─────────────────────────────────────────┐
│ PATTERN THE METAL LAYER TO FORM ONE OR   │
│        MORE TRENCHES 106                 │
└─────────────────────────────────────────┘
                    ↓
┌─────────────────────────────────────────┐
│   SELECTIVELY DEPOSIT BARRIER LAYER 108  │
└─────────────────────────────────────────┘
                    ↓
┌─────────────────────────────────────────┐
│      FORM A CATALYST LAYER 110           │
└─────────────────────────────────────────┘
                    ↓
┌─────────────────────────────────────────┐
│ DEPOSIT IMD LAYER OVER THE CATALYST LAYER│
│                112                       │
└─────────────────────────────────────────┘
                    ↓
┌─────────────────────────────────────────┐
│  REMOVE THE BARRIER LAYER TO FORM AIR    │
│ GAPS BETWEEN THE PATTERNED METAL LAYER   │
│      AND THE IMD LAYER 114               │
└─────────────────────────────────────────┘
                    ↓
┌─────────────────────────────────────────┐
│ DEPOSIT AN ETCH STOP LAYER AND AN ILD LAYER│
│                116                       │
└─────────────────────────────────────────┘
                    ↓
┌─────────────────────────────────────────┐
│ PATTERN THE ETCH STOP AND ILD LAYERS TO  │
│       FORM A VIA OPENING 118             │
└─────────────────────────────────────────┘
                    ↓
┌─────────────────────────────────────────┐
│    DEPOSIT A DIFFUSION BARRIER 120       │
└─────────────────────────────────────────┘
                    ↓
┌─────────────────────────────────────────┐
│        DEPOSIT A METAL LAYER 122         │
└─────────────────────────────────────────┘
```

FIG. 1

METHOD FOR MANUFACTURING INTERCONNECT STRUCTURES INCLUDING AIR GAPS

BACKGROUND

The electronics industry has experienced an ever-increasing demand for smaller and faster semiconductor devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, the formation of high-quality interconnects, including reliable metal lines and vias, has proved challenging. In particular, with the continued scaling of IC dimensions, and the corresponding reduction of layer thicknesses (e.g., metal, dielectric, and barrier layer thicknesses), parasitic resistance and capacitance (and the associated RC delay) of metal interconnect layers has become a critical issue. For example, in some existing metallization techniques, diffusion barrier layers (e.g., such as TaN) remaining after metallization can cause increased resistance. In addition, such diffusion barrier layers, which may have high dielectric constants, typically surround metal lines and cause increased capacitance. Further, after deposition of an inter-metal dielectric (IMD) layer, at least some existing techniques require a chemical mechanical polishing (CMP) process. CMP can be an expensive process, especially for IMD layers, which are generally harder than the metal used for metallization.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method of forming a barrier-free interconnect layer, in accordance with some embodiments;

DETAILED DESCRIPTION

Figure 2:
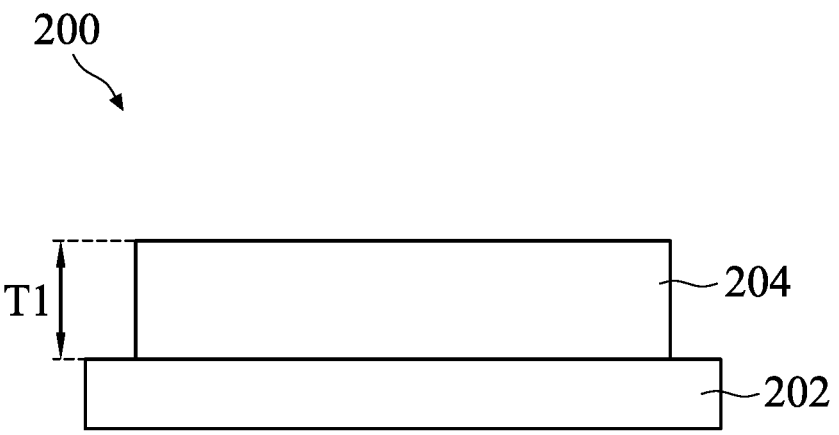
FIGS. 2, 3, 4, 5, 6, 7, 8, 9, and 10 provide cross-sectional views of a device at intermediate stages of fabrication and processed in accordance with the method of FIG.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of barrier-free interconnect layers employed within a back-end-of-line (BEOL) process where a multi-level metal interconnect network is fabricated. In some embodiments, the barrier-free interconnect layers described herein may be employed within a local interconnect structure, an intermediate interconnect structure, and/or a global interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of a BEOL fabrication processes and include a multi-level network of metal wiring. One of ordinary skill may recognize other embodiments of interconnect layers that may benefit from aspects of the present disclosure.

In addition, and in some embodiments, the techniques described herein and including the disclosed barrier-free interconnect layers may be employed within other semiconductor structures, circuits, and devices such as planar bulk metal-oxide-semiconductor field-effect transistors (MOSFETs), complementary MOS (CMOS) devices, multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, memory devices such as flash memory (e.g., NAND or NOR flash memory), logic circuits, or other structures, circuits, or devices. One of ordinary skill may recognize other embodiments of semiconductor structures, circuits, or devices that may benefit from aspects of the present disclosure. Moreover, any of a plurality of IC circuits and/or devices may be connected by interconnects formed during a BEOL process.

With the aggressive scaling and ever-increasing complexity of advanced semiconductor devices and circuits, the formation of high-quality interconnects, including reliable metal lines and vias, has proved challenging. In particular, with the continued scaling of IC dimensions, and the corresponding reduction of layer thicknesses (e.g., metal, dielectric, and barrier layer thicknesses), parasitic resistance and capacitance (and the associated RC delay) of metal interconnect layers has become a critical issue. For example, in some existing metallization techniques, diffusion barrier layers (e.g., such as TaN) remaining after metallization can cause increased resistance. In addition, such diffusion barrier layers, which may have high dielectric constants, typically surround metal lines and cause increased capacitance. Further, after deposition of an inter-metal dielectric (IMD) layer, at least some existing techniques require a chemical mechanical polishing (CMP) process. CMP can be an expensive process, especially for IMD layers, which are generally harder than the metal used for metallization. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include a barrier-free interconnect layer, and related methods, that effectively serve to overcome various shortcomings of existing methods. In at least some embodiments, a metal interconnect layer is patterned to form trenches in the metal interconnect layer within which an IMD layer will be deposited. Prior to IMD layer deposition, a selectively deposited barrier layer is formed on sidewalls, but not along a bottom surface, of the trenches in the metal interconnect layer and thereby reduces parasitic resistance and associated RC delay. In some examples, the selectively deposited barrier layer may include a self-assembled monolayer (SAM) or a polymer layer. In various embodiments, the SAM or polymer layer may be deposited using a vapor process (e.g., such as a chemical vapor deposition process, an atomic layer deposition process, or a molecular layer deposition process) or by a wet process (e.g., such as spin-on coating, tape casting, spraying, or dipping). In some embodiments, the SAM or polymer layer may include a specific functional group (e.g., selected based on the type of metal material of the metal interconnect layer), that causes the SAM or polymer layer to be selectively deposited onto metal surfaces of the patterned metal interconnect layer. In some cases, the functional group includes phosphonic acid (e.g., such as octadecylphosphonic acid), organosulfurs, hydroxide, or thiols (e.g., dodecanethiol, alkanethiol). As one example, if the metal material of the metal interconnect layer includes cobalt (Co), then phosphonic acid may be used as the functional group. If the metal material of the metal interconnect layer is copper (Cu), then a thiol may be used as the functional group.

Further, embodiments of the present disclosure include use of a catalyst layer for rapid atomic layer deposition (ALD) of the IMD layer. By employing the catalyst layer, a duration of the ALD IMD layer deposition process can be reduced by around 90%, thereby increasing processing throughput. In addition, the disclosed ALD IMD layer deposition process provides excellent thickness control and conformity of the IMD layer. As a result, and according to various embodiments, there is no need to perform a CMP process of the IMD layer, thus avoiding costly and difficult processing. After deposition of the IMD layer, and in some examples, the selectively deposited barrier layer (e.g., the SAM or polymer layer) can be removed to form an air gap between the patterned metal interconnect layer and the ALD-deposited IMD layer. Thus, rather than having a barrier layer with a high dielectric constant surrounding metal interconnect lines, embodiments of the present disclosure provide air gaps (e.g., with a dielectric constant of one (1)) surrounding the metal interconnect lines and thereby greatly reducing parasitic capacitance and associated RC delay. Further, and according to various embodiments, because the metal interconnect lines are not in contact with the IMD layer, but are instead separated by the air gaps, metal will not diffuse into the IMD layer. Therefore, an additional diffusion barrier layer is not needed. Additional details of embodiments of the present disclosure are provided below, and additional benefits and/or other advantages will become apparent to those skilled in the art having benefit of the present disclosure.

Referring now to FIG. 1, illustrated is a method 100 of forming a barrier-free interconnect layer, in accordance with some embodiments. The method 100 is described below in more detail with reference to FIGS. 2-10. It will be understood that additional process steps may be implemented before, during, and after the method 100, and some process steps described may be replaced or eliminated in accordance with various embodiments of the method 100. It will be further understood that parts of the method 100 may be fabricated by a well-known complementary metal-oxide-semiconductor (CMOS) technology process flow, and thus some processes are only briefly described herein.

The method 100 begins at block 102 where a substrate including one or more semiconductor devices is provided. With reference to FIG. 2, and in an embodiment of block 102, a device 200 including a substrate 202 is provided, where the substrate 202 includes one or more semiconductor devices. In some embodiments, the substrate 202 and the semiconductor devices therein may include devices such as those described below with reference to FIGS. 11 and 12. By way of example, the semiconductor devices formed within the substrate 202 may be formed as part of a front-end-of-line (FEOL) process.

The method 100 proceeds to block 104 where a metal layer is formed as part of an interconnect network. Still referring to FIG. 2, and in an embodiment of block 104, a portion of a multi-level metal interconnect network, including a metal layer 204, may be formed over the substrate 202 (e.g., as part of a BEOL process). In some cases, the metal layer 204 may include a portion of a metal line (of the multi-level metal interconnect network) that includes a copper (Cu) layer, an aluminum (Al) layer, an aluminum copper (AlCu) alloy layer, a ruthenium (Ru) layer, a cobalt (Co) layer, or other appropriate metal layer. In other examples, the metal layer 204 may include a portion of a metal via (of the multi-level metal interconnect network) that includes a Cu layer, an Al layer, an AlCu alloy layer, a Ru layer, a Co layer, a tungsten (W) layer, or other appropriate metal layer. In some examples, the metal layer 204 may be deposited by physical vapor deposition (PVD), chemical vapor deposition (CVD), electrochemical plating (ECP), electroless deposition (ELD), ALD, or a combination thereof. In some embodiments, the metal layer 204 may have a thickness 'T1' in a range of about 30-50 nm. In various embodiments, and prior to the deposition of the metal layer 204, additional openings and metal layers (e.g., which may include additional metal lines or metal vias) may be formed beneath the metal layer 204 so as to provide electrical connections between underlying semiconductor devices (e.g., within the substrate 202) and the subsequently deposited metal layer 204.

Figure 3:
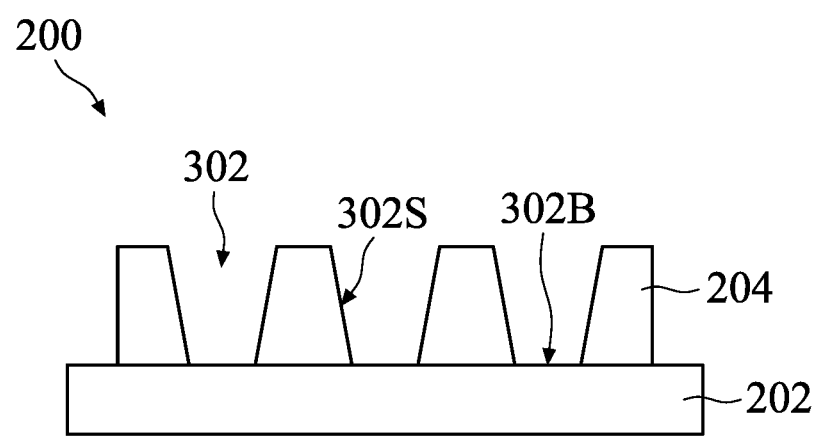

After formation of the metal layer 204, the method 100 proceeds to block 106 where the metal layer is patterned to form one or more trenches in the metal layer 204 within which an IMD layer will be subsequently formed. With reference to FIGS. 2 and 3, and in an embodiment of block 106, the metal layer 204 may be patterned using a combination of photolithography (e.g., including photoresist deposition, exposure, and development) and etching (e.g., using a wet or dry etching process) to form trenches 302 within the metal layer 204. As shown, the trenches 302 include sidewall surfaces 302S and a bottom surface 302B. In some embodiments, the etching process includes a reactive ion etching (RIE) process. The RIE process may, in some examples, be performed using a chlorine-based chemical (e.g., such as $CHCl_3$). In the example of FIG. 3, the trenches 302 are shown as having a trapezoidal shape. However, in some embodiments, the trenches 302 may have a rectangular shape. In some cases, a critical dimension (CD) of the trenches 302 may have a value in a range of about 10-12 nm.

Figure 4:
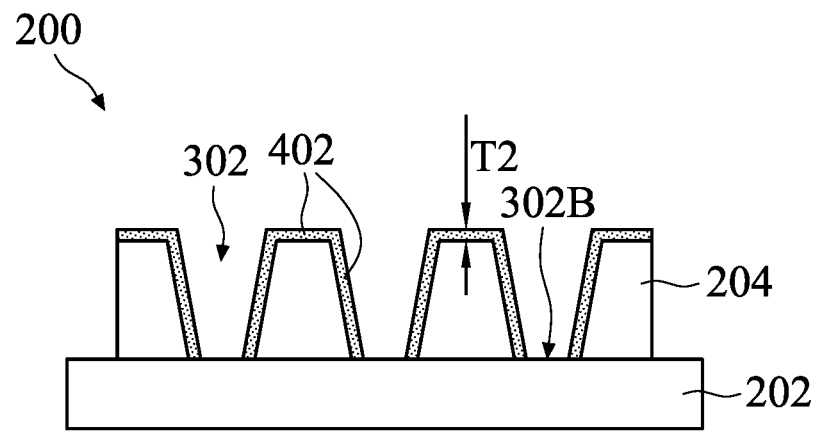

After formation of the trenches 302, the method 100 proceeds to block 108 where a barrier layer is selectively deposited. With reference to FIGS. 3 and 4, and in an embodiment of block 108, a barrier layer 402 is deposited over the substrate 202. In particular, the barrier layer 402 is selectively deposited on metal surfaces of the patterned metal layer 204, including on top surfaces of the patterned metal layer 204 and along sidewall surfaces 302S of the trenches 302, but not on the bottom surface 302B. In various embodiments, the barrier layer 402 includes an organic spacer layer such as a SAM or a polymer layer. In some embodiments, the organic spacer layer may include a specific functional group (e.g., selected based on a material used for the metal layer 204), that causes the barrier layer 402 to be selectively deposited onto metal surfaces of the patterned metal layer 204, while not being deposited on the bottom surface 302B of the trenches 302. In some examples, the functional group includes phosphonic acid (e.g., such as octadecylphosphonic acid), organosulfurs, hydroxide, or thiols (e.g., dodecanethiol, alkanethiol). As one example, if the patterned metal layer 204 includes cobalt (Co), then phosphonic acid may be used as the functional group. If the patterned metal layer 204 includes copper (Cu), then a thiol may be used as the functional group. In various embodiments, the barrier layer 402 may be deposited using a vapor process (e.g., such as a chemical vapor deposition process, an atomic layer deposition process, or a molecular layer deposition process) or by a wet process (e.g., such as spin-on coating, tape casting, spraying, or dipping). In some embodiments, the barrier layer 402 may have a thickness 'T2' in a range of about 10-50 A. In some cases, the thickness of the barrier layer 402 may be substantially the same along both top surfaces of the patterned metal layer 204 and along sidewall surfaces 302S of the trenches 302. In an example, the barrier layer 402 may be deposited using a spin-coating process with a spin speed of about 400-1000 RPM, a spin duration of about 10 s, and a solution concentration of about 1 mM.

Figure 5:
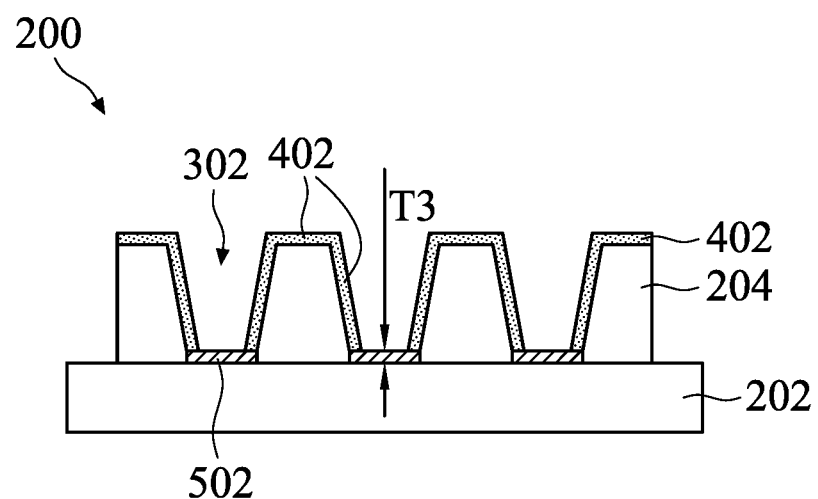

After selective deposition of the barrier layer 402, the method 100 proceeds to block 110 where a catalyst layer is formed. With reference to FIGS. 4 and 5, and in an embodiment of block 110, a catalyst layer 502 is formed along the bottom surface 302B of the trenches 302. In some embodiments, the catalyst layer 502 includes a layer of trimethylaluminium (TMA). In some embodiments, the catalyst layer 502 is formed by exposing the device 200 to a precursor (e.g., such as TMA) for a soaking period. In some examples, a CVD or ALD system may be used to expose the device 200 to the precursor for the soaking period (e.g., as part of a CVD or ALD process). In some embodiments, the catalyst layer 502 has a thickness 'T3' of about one (1) molecular layer or less than about 5 A. The catalyst layer 502, as shown in the example of FIG. 5, is formed by adsorption of precursor molecules only on areas of the device 200 that are not covered by the barrier layer 402 (e.g., the bottom surface 302B of the trenches 302). In various embodiments, the catalyst layer 502 serves to catalyze the IMD layer deposition process, as described below.

Figure 6:
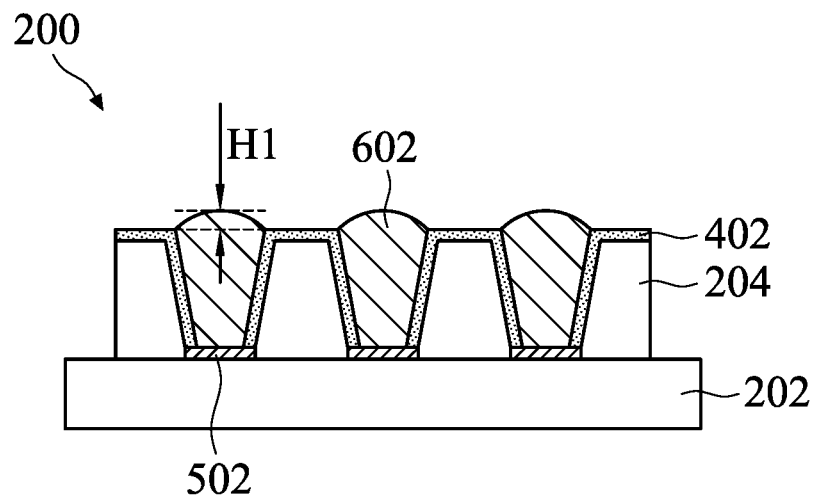

The method 100 proceeds to block 112 where an IMD layer is deposited over the catalyst layer. With reference to FIGS. 5 and 6, and in an embodiment of block 112, an IMD layer 602 is deposited within the trenches 302 and over the catalyst layer 502. In some embodiments, the IMD layer 602 is deposited by ALD. However, because of the catalyst layer 502, the ALD deposition of the IMD layer 602 proceeds significantly more rapidly than would be possible without the catalyst layer 502. In some examples, by employing the catalyst layer 502, a duration of the ALD IMD layer deposition process may be reduced by around 90% as compared to ALD IMD layer deposition without the catalyst layer 502. As such, processing throughput is markedly increased. In some embodiments, the IMD layer 602 may include SiOx, SiCOH, boron carbide, or other appropriate material. By way of example, the IMD layer 602 may be formed by exposing the device 200 to an appropriate precursor (e.g., such as a SiOx, SiCOH, or boron carbide precursor(s)) for a soaking period. In some cases, a top portion of the IMD layer 602 may include a small hump having a height 'H1' in a range of about 0-10 A. Regardless of the possibility of forming such a hump, the rapid ALD IMD layer deposition process provides excellent thickness control and conformity of the IMD layer 602. As a result, and according to various embodiments, there is no need to perform a CMP process of the as-deposited IMD layer 602, thus avoiding costly and difficult processing. Stated another way, the rapid ALD IMD layer deposition process used to form the IMD layer 602 provides for a substantially planar top surface of the device 200 after deposition of the IMD layer 602.

In some embodiments, the IMD layer 602 may alternatively include a low-K dielectric layer (e.g., having a dielectric constant less than that of $SiO_2$ which is about 3.9) such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable low-K dielectric material. In some alternative techniques, the IMD layer 602 may be deposited by a subatmospheric CVD (SACVD) process, a flowable CVD process, or other suitable deposition technique.

Figure 7:
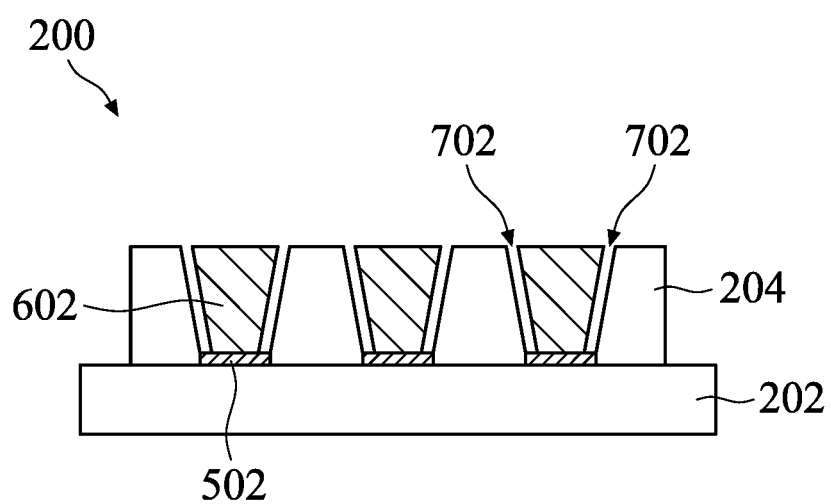

After depositing the IMD layer 602, the method 100 proceeds to block 114 where the barrier layer is removed to form air gaps between the patterned metal layer and the IMD layer. With reference to FIGS. 6 and 7, and in an embodiment of block 114, the selectively deposited barrier layer 402 is removed to form air gaps 702 between the patterned metal layer 204 and the IMD layer 602. In some cases, the barrier layer 402 may be removed using an $NH_3$ plasma treatment, an $H_2$ plasma treatment, or other appropriate wet or dry etching process. By way of example, the $NH_3$ or $H_2$ plasma treatment may be performed at a power of between about 500-1200 W and for a duration of between about 10-15 s. In some embodiments, the plasma treatment may planarize a top surface of the IMD layer 602. In contrast to some existing embodiments that include a high dielectric constant barrier layer surrounding metal interconnect lines, embodiments of the present disclosure provide the air gaps 702 (e.g., with a dielectric constant of one (1)) surrounding the patterned metal layer 204. As a result, the parasitic capacitance and associated RC delay of the device 200 is greatly reduced. Further, and because the patterned metal layer 204 is not in contact with the IMD layer 602, but is instead separated by the air gaps 702, metal will not diffuse into the IMD layer 602. Therefore, an additional diffusion barrier layer is not needed.

Figure 8:
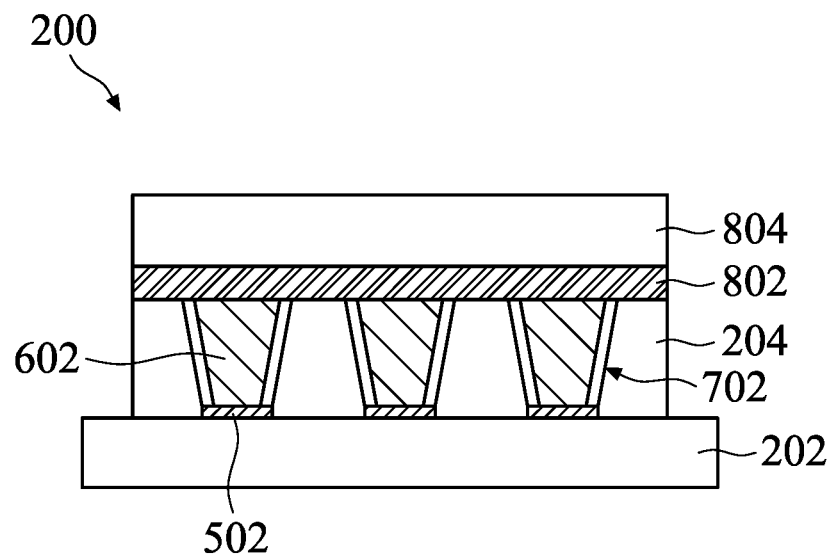

After formation of the air gaps 702, the method 100 proceeds to block 116 where an etch stop layer (ESL) and an inter-layer dielectric (ILD) layer are deposited. With reference to FIGS. 7 and 8, and in an embodiment of block 116, an ESL 802 is deposited over the device 200. The ESL 802 may comprise a single layer or multiple layers. In addition to providing an etch stop, the ESL 802 may also improve etching uniformity. In some embodiments, the ESL 802 may include one or more of AlOx, AlZrOx, ZrOx, SiCN, SiO, SiOC, or other appropriate material. In various examples, the ESL 802 may have a thickness in a range of about 30-100 A. In some cases, the ESL 802 may be deposited by ALD, CVD, PVD, or other appropriate deposition method.

Still referring to FIG. 8, and in a further embodiment of block 116, an ILD layer 804 is deposited over the ESL 802. In some embodiments, the ILD layer 804 may include a dielectric material such as SiCOH, SiOx, or other appropriate material. In some embodiments, ILD layer 804 may alternatively include a low-K dielectric layer such as TEOS oxide, un-doped silicate glass, or doped silicon oxide such as BPSG, FSG, PSG, BSG, and/or other suitable low-K dielectric material. In various examples, the ILD layer 804 may have a thickness in a range of about 300-500 A. In some cases, ILD layer 804 may be deposited by ALD, CVD, PVD, SACVD, flowable CVD, or other suitable deposition technique.

Figure 9:
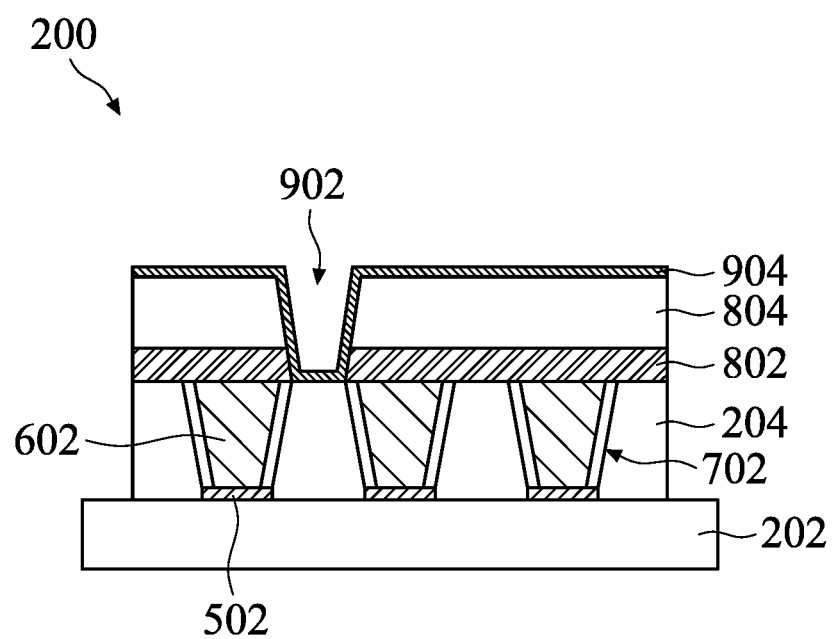

After deposition of the ILD layer 804, the method 100 proceeds to block 118 where the ESL 802 and the ILD layer 804 are patterned to form a via opening. With reference to FIGS. 8 and 9, and in an embodiment of block 118, the ESL 802 and the ILD layer 804 may be patterned using a combination of photolithography (e.g., including photoresist deposition, exposure, and development) and etching (e.g., using a wet or dry etching process) to form a via opening 902 within the ESL 802 and the ILD layer 804. In the example of FIG. 9, the via opening 902 is shown as having a trapezoidal shape. However, in some embodiments, the via opening 902 may have a rectangular shape.

The method 100 proceeds to block 120 where a diffusion barrier is deposited. Still with reference to FIG. 9, and in an embodiment of block 120, a diffusion barrier 904 is deposited over the device 200 and within the via opening 902, including along sidewalls and the bottom surface of the via opening 902. In some embodiments, the diffusion barrier 904 is conformally deposited, thus a thickness of the diffusion barrier 904 over the device 200 is substantially uniform. In some examples, the diffusion barrier 904 may have a thickness in a range of about 10-30 A. The diffusion barrier 904 may be deposited by CVD, ALD, or PVD. In some cases, the diffusion barrier 904 may include TaN, SiN, or other appropriate material.

Figure 10:
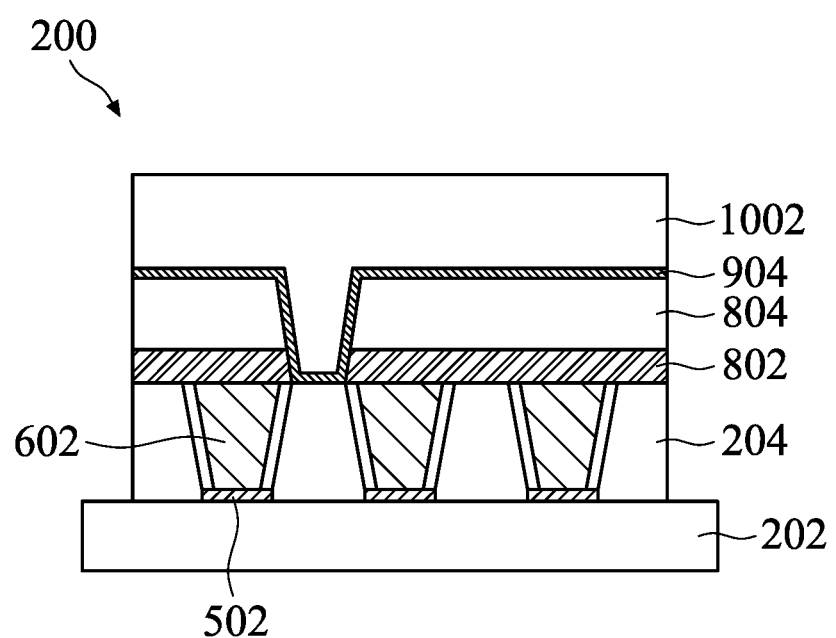

After deposition of the diffusion barrier 904, the method 100 proceeds to block 122 where a metal layer is deposited. With reference to FIGS. 9 and 10, and in an embodiment of block 122, a metal layer 1002 is deposited over the diffusion barrier 904 and within the via opening 902. Thus, the metal layer 1002 provides electrical contact to the underlying metal layer 204. In some embodiments, the metal layer 1002 may have a thickness in a range of about 30-50 A. In some cases, the metal layer 1002 may be deposited by ECP, ELD, PVD, ALD, or other appropriate process.

As discussed above, the semiconductor devices formed within the substrate 202 may include devices such as those described with reference to FIGS. 11 and 12. In addition, while the above discussion presented embodiments for forming a barrier-free interconnect layer within a BEOL process, the techniques described herein may be employed to form barrier-free metal layers for metal layers formed as part of the fabrication of devices in a FEOL process, such as those described with reference to FIGS. 11 and 12. As such, the devices of FIGS. 11 and 12 will now be discussed.

Figure 11:
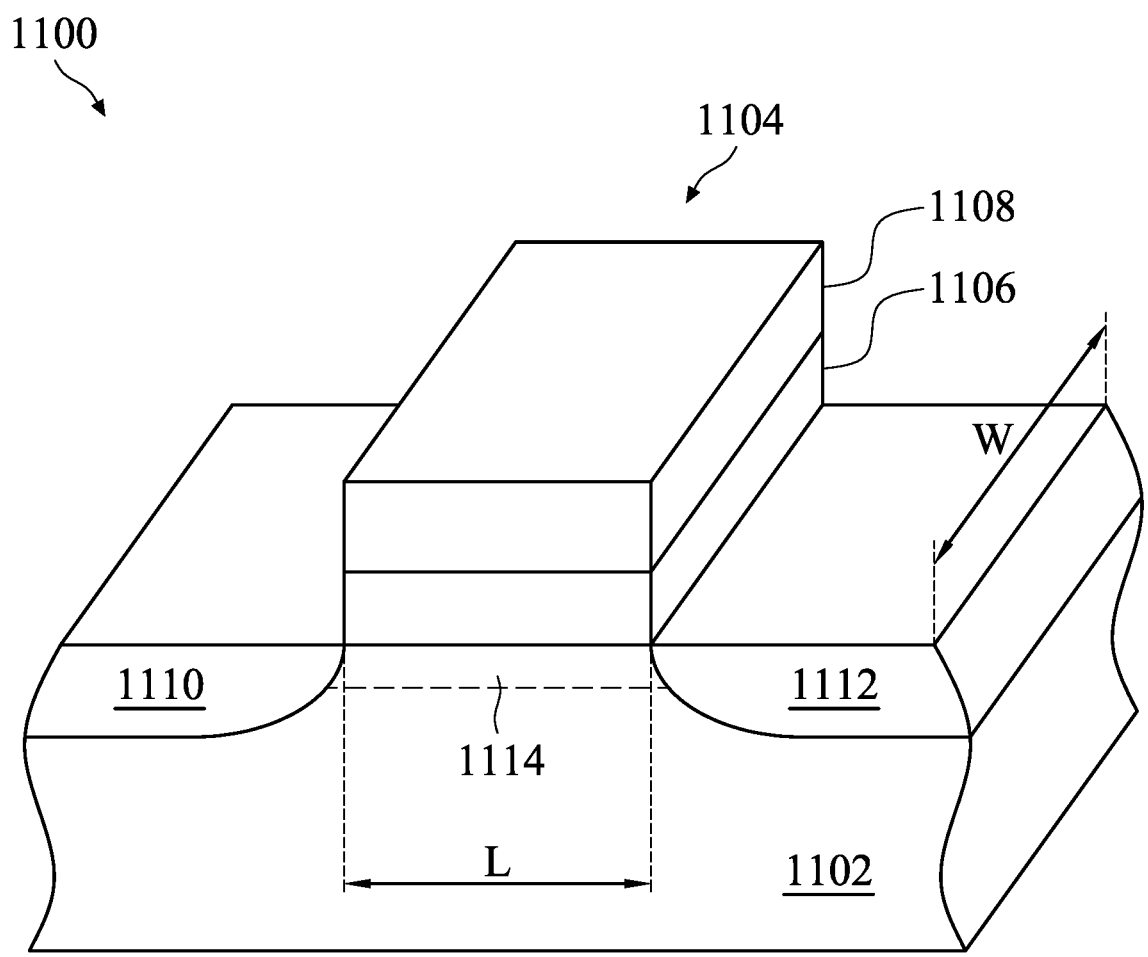
FIG. 11 is a cross-sectional view of an MOS transistor according to some embodiments.

Referring first to the example of FIG. 11, illustrated therein is an MOS transistor 1100, providing an example of merely one device type which may include embodiments of the present disclosure. The transistor 1100 is fabricated on a substrate 1102 and includes a gate stack 1104. The substrate 1102 may be a semiconductor substrate such as a silicon substrate. The substrate 1102 may include various layers, including conductive or insulating layers formed on the substrate 1102. The substrate 1102 may include various doping configurations depending on design requirements as is known in the art. The substrate 1102 may also include other semiconductors such as germanium, silicon carbide (SiC), silicon germanium (SiGe), or diamond. Alternatively, the substrate 1102 may include a compound semiconductor and/or an alloy semiconductor. Further, in some embodiments, the substrate 1102 may include an epitaxial layer (epi-layer), the substrate 1102 may be strained for performance enhancement, the substrate 1102 may include a silicon-on-insulator (SOI) structure, and/or the substrate 1102 may have other suitable enhancement features.

The gate stack 1104 includes a gate dielectric 1106 and a gate electrode 1108 disposed on the gate dielectric 1106. In some embodiments, the gate dielectric 1106 may include an interfacial layer such as silicon oxide layer ($SiO_2$) or silicon oxynitride (SiON), where such interfacial layer may be formed by chemical oxidation, thermal oxidation, ALD, CVD, and/or other suitable method. In some examples, the gate dielectric 1106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 1106 may include silicon dioxide or other suitable dielectric. The gate dielectric 1106 may be formed by ALD, PVD, CVD, oxidation, and/or other suitable methods.

In some embodiments, the gate electrode 1108 may be deposited as part of a gate first or gate last (e.g., replacement gate) process. In various embodiments, the gate electrode 1108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 1108 may include a first metal material for an N-type transistor and a second metal material for a P-type transistor. Thus, the transistor 1100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 1114 of the transistor 1100. Similarly, the second metal material (e.g., for P-type devices) may include metals having a work function substantially aligned with a work function of the substrate valence band, or at least substantially aligned with a work function of the valence band of the channel region 1114 of the transistor 1100. Thus, the gate stack 1104 may provide a gate electrode for the transistor 1100, including both N-type and P-type devices. In some embodiments, the gate electrode 1108 may alternately or additionally include a polysilicon layer. In various examples, the gate electrode 1108 may be formed using PVD, CVD, electron beam (e-beam) evaporation, and/or other suitable process. In some embodiments, sidewall spacers are formed on sidewalls of the gate stack 1104. Such sidewall spacers may include a dielectric material such as silicon oxide, silicon nitride, silicon carbide, silicon oxynitride, or combinations thereof.

The transistor 1100 further includes a source region 1110 and a drain region 1112 each formed within the semiconductor substrate 1102, adjacent to and on either side of the gate stack 1104. In some embodiments, the source and drain regions 1110, 1112 include diffused source/drain regions, ion implanted source/drain regions, epitaxially grown regions, or a combination thereof. The channel region 1114 of the transistor 1100 is defined as the region between the source and drain regions 1110, 1112 under the gate dielectric 1106, and within the semiconductor substrate 1102. The channel region 1114 has an associated channel length "L" and an associated channel width "W". When a bias voltage greater than a threshold voltage ($V_t$) (i.e., turn-on voltage) for the transistor 1100 is applied to the gate electrode 1108 along with a concurrently applied bias voltage between the source and drain regions 1110, 1112, an electric current (e.g., a transistor drive current) flows between the source and drain regions 1110, 1112 through the channel region 1114. The amount of drive current developed for a given bias voltage (e.g., applied to the gate electrode 1108 or between the source and drain regions 1110, 1112) is a function of, among others, the mobility of the material used to form the channel region 1114. In some examples, the channel region 1114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2/V$-s and an intrinsic hole mobility at room temperature (300 K) of around 480 $cm^2/V$-s.

Figure 12:
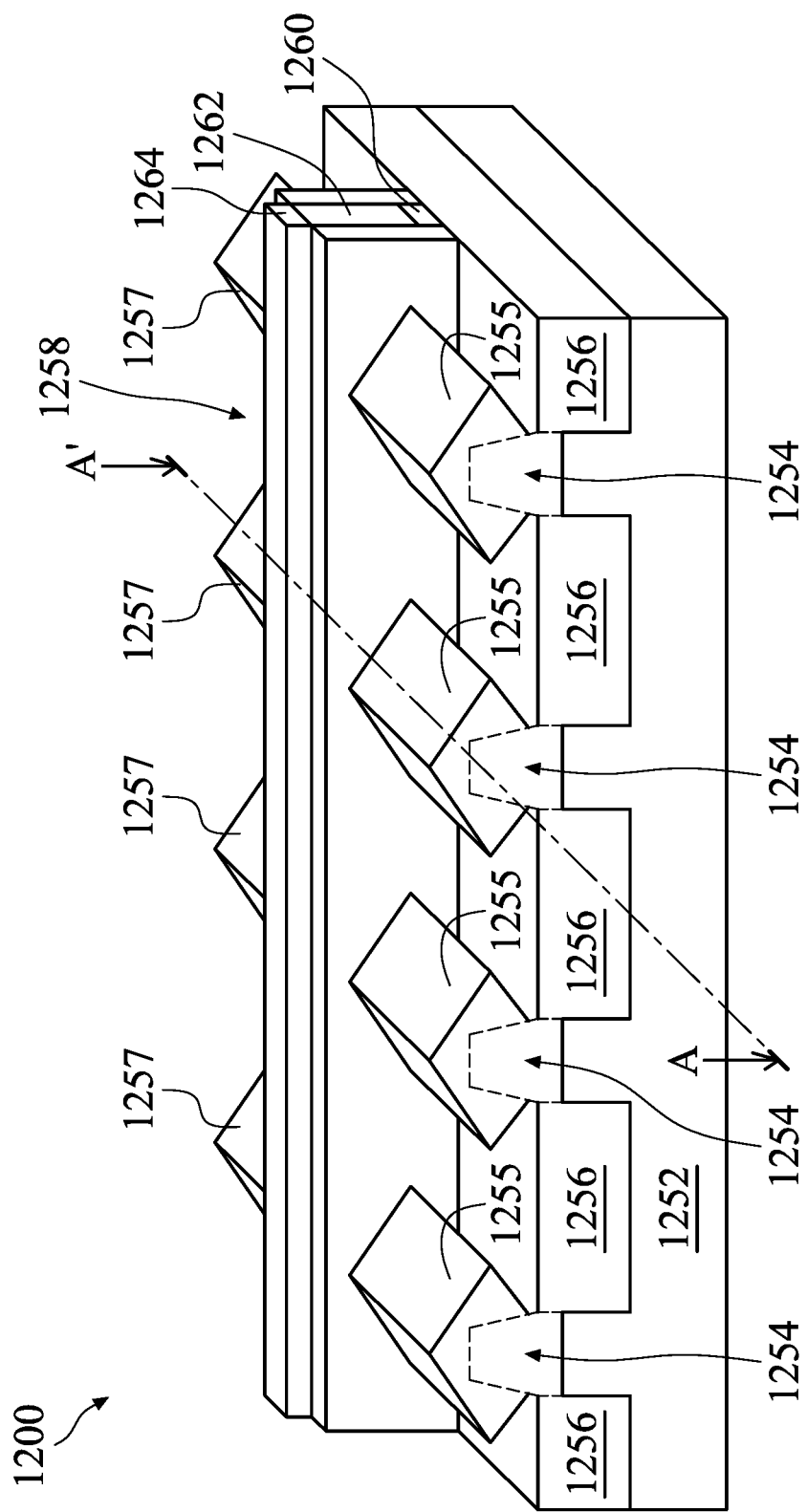
FIG. 12 is perspective view of an embodiment of a FinFET device according to one or more aspects of the present disclosure.

Referring now to FIG. 12, illustrated therein is a FinFET device 1200, providing an example of an alternative device type which may include embodiments of the present disclosure. By way of example, the FinFET device 1200 includes one or more fin-based, multi-gate field-effect transistors (FETs). The FinFET device 1200 includes a substrate 1252, at least one fin element 1254 extending from the substrate 1252, isolation regions 1256, and a gate structure 1258 disposed on and around the fin-element 1254. The substrate 1252 may be a semiconductor substrate such as a silicon substrate. In various embodiments, the substrate 1252 may be substantially the same as the substrate 1102 and may include one or more of the materials used for the substrate 1102, as described above.

The fin-element 1254, like the substrate 1252, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 1254 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin 1254. The recesses may be etched using a dry etch (e.g., chemical oxide removal), a wet etch, and/or other suitable processes. Numerous other embodiments of methods to form the fins 1254 on the substrate 1252 may also be used.

Each of the plurality of fins 1254 also include a source region 1255 and a drain region 1257 where the source/drain regions 1255, 1257 are formed in, on, and/or surrounding the fin 1254. The source/drain regions 1255, 1257 may be epitaxially grown over the fins 1254. In addition, a channel region of a transistor is disposed within the fin 1254, underlying the gate structure 1258, along a plane substantially parallel to a plane defined by section AA' of FIG. 12. In some examples, the channel region of the fin includes a high-mobility material, as described above.

The isolation regions 1256 may be shallow trench isolation (STI) features. Alternatively, a field oxide, a LOCOS feature, and/or other suitable isolation features may be implemented on and/or within the substrate 1252. The isolation regions 1256 may be composed of silicon oxide, silicon nitride, silicon oxynitride, FSG, a low-k dielectric, combinations thereof, and/or other suitable material known in the art. In an embodiment, the isolation regions 1256 are STI features and are formed by etching trenches in the substrate 1252. The trenches may then be filled with isolating material, followed by a CMP process. However, other embodiments are possible. In some embodiments, the isolation regions 1256 may include a multi-layer structure, for example, having one or more liner layers.

The gate structure 1258 includes a gate stack having an interfacial layer 1260 formed over the channel region of the fin 1254, a gate dielectric layer 1262 formed over the interfacial layer 1260, and a metal layer 1264 formed over the gate dielectric layer 1262. In various embodiments, the interfacial layer 1260 is substantially the same as the interfacial layer described as part of the gate dielectric 1106. In some embodiments, the gate dielectric layer 1262 is substantially the same as the gate dielectric 1106 and may include high-k dielectrics similar to that used for the gate dielectric 1106. Similarly, in various embodiments, the metal layer 1264 is substantially the same as the gate electrode 1108, described above. In some embodiments, sidewall spacers are formed on sidewalls of the gate structure 1258. The sidewall spacers may include a dielectric material such as silicon oxide, silicon nitride, silicon carbide, silicon oxynitride, or combinations thereof.

As discussed above, each of the transistor 1100 and FinFET device 1200 may include barrier-free metal layers formed as described above, where a selectively deposited barrier layer is deposited before a dielectric layer deposition adjacent to a metal layer, and where the selectively deposited barrier layer is subsequently removed to form air gaps between the dielectric layer and the adjacent metal layer.

The various embodiments described herein thus offer several advantages over the existing art. It will be understood that not all advantages have been necessarily discussed herein, no particular advantage is required for all embodiments, and other embodiments may offer different advantages. As one example, embodiments discussed herein include a barrier-free interconnect layer, and related methods, that effectively serve to overcome various shortcomings of existing methods. In at least some embodiments, and prior to IMD layer deposition, a selectively deposited barrier layer is formed on sidewalls, but not along a bottom surface, of trenches formed within a metal interconnect layer. In some examples, the selectively deposited barrier layer may include a SAM or a polymer layer. In various embodiments, the SAM or polymer layer may be deposited using a vapor processor by a wet process. In some embodiments, the SAM or polymer layer may include a specific functional group that causes the SAM or polymer layer to be selectively deposited onto metal surfaces of the patterned metal interconnect layer. In some cases, the functional group includes phosphonic acid, organosulfurs, hydroxide, or thiols.

Further, embodiments of the present disclosure include use of a catalyst layer for rapid ALD deposition of the IMD layer. By employing the catalyst layer, a duration of the ALD IMD layer deposition process can be reduced by around 90%, thereby increasing processing throughput. In addition, the disclosed ALD IMD layer deposition process provides excellent thickness control and conformity of the IMD layer. As a result, there is no need to perform a CMP process of the IMD layer, thus avoiding costly and difficult processing. After deposition of the IMD layer, and in some examples, the selectively deposited barrier layer can be removed to form an air gap between the patterned metal interconnect layer and the ALD-deposited IMD layer. Thus, rather than having a barrier layer with a high dielectric constant surrounding metal interconnect lines, embodiments of the present disclosure provide air gaps surrounding the metal interconnect lines and thereby greatly reducing parasitic capacitance and associated RC delay. Further, and according to various embodiments, because the metal interconnect lines are not in contact with the IMD layer, but are instead separated by the air gaps, metal will not diffuse into the IMD layer. Therefore, an additional diffusion barrier layer is not needed. Additional benefits and/or other advantages will become apparent to those skilled in the art having benefit of the present disclosure.

Thus, one of the embodiments of the present disclosure described a method for fabricating a semiconductor device including patterning a metal layer disposed over a substrate to form a patterned metal layer including one or more trenches. In some embodiments, the method further includes selectively depositing a barrier layer on metal surfaces of the patterned metal layer within the one or more trenches. In some examples, and after selectively depositing the barrier layer, a dielectric layer is deposited within the one or more trenches. Thereafter, the selectively deposited barrier layer may be removed to form air gaps between the patterned metal layer and the dielectric layer.

In another of the embodiments, discussed is a method of fabricating a semiconductor device including forming a portion of a multi-level metal interconnect network including a first metal region and a second metal region. The first metal region and the second metal region are separated by a trench, where a first side of the first metal region defines a first trench sidewall, and where a second side of the second metal region defines a second trench sidewall opposing the first trench sidewall. In some embodiments, the method further includes depositing an organic spacer layer on the first trench sidewall and the second trench sidewall, while a trench bottom surface that interposes the first and second trench sidewalls remains substantially free of the organic spacer layer. By way of example, and after depositing the organic spacer layer, an IMD layer is formed within the trench and over the trench bottom surface. In some embodiments, and after forming the IMD layer, the organic spacer layer is etched to form a first air gap separating the first trench sidewall from the IMD layer and a second air gap separating the second trench sidewall from the IMD layer.

In yet another of the embodiments, discussed is a device including a substrate having one or more semiconductor devices. In some embodiments, the device further includes a metal interconnect layer disposed over the substrate and having a plurality of metal regions interposed by a plurality of dielectric layer regions. In various examples, each of the plurality of metal regions is separated from an adjacent dielectric layer region of the plurality of dielectric layer regions by an air gap. In some embodiments, the metal interconnect layer provides an electrical connection to the one or more semiconductor devices. The device may further include a catalyst layer interposing the substrate and each of the plurality of dielectric layer regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

patterning a metal layer disposed over a substrate to form a patterned metal layer including one or more trenches;

selectively depositing a barrier layer on metal surfaces of the patterned metal layer within the one or more trenches and on top metal surfaces of the patterned metal layer between the one or more trenches, the barrier layer including a self-assembled monolayer (SAM);

after the selectively depositing the barrier layer, and while the barrier layer remains on the top metal surfaces of the patterned metal layer between the one or more trenches, depositing a dielectric layer within the one or more trenches; and removing the selectively deposited barrier layer using a plasma treatment to form air gaps between the patterned metal layer and the dielectric layer, wherein the plasma treatment planarizes a top surface of the dielectric layer within the one or more trenches.

2. The method of claim 1, wherein the metal layer is part of a multi-level metal interconnect network.

3. The method of claim 2, wherein the metal layer includes a metal line or a metal via of the multi-level metal interconnect network.

4. The method of claim 1, wherein the one or more trenches include sidewall surfaces and a bottom surface, and wherein the barrier layer is selectively deposited on the sidewall surfaces without being deposited on the bottom surface.

5. The method of claim 1, wherein the barrier layer includes a functional group that causes the barrier layer to be selectively deposited on the metal surfaces.

6. The method of claim 5, wherein the functional group includes phosphonic acid, organosulfurs, hydroxide, or thiols.

7. The method of claim 4, further comprising:
prior to depositing the dielectric layer, forming a catalyst layer on the bottom surface of the one or more trenches; and
after the forming the catalyst layer, depositing the dielectric layer on the catalyst layer within the one or more trenches.

8. The method of claim 7, wherein the depositing the dielectric layer includes depositing the dielectric layer using an atomic layer deposition (ALD) process, and wherein the catalyst layer serves to catalyze the ALD process.

9. A method of fabricating a semiconductor device, comprising:
forming a portion of a multi-level metal interconnect network including a first metal region and a second metal region, wherein the first metal region and the second metal region are separated by a trench having a trapezoidal shape, wherein a first side of the first metal region defines a first trench sidewall, and wherein a second side of the second metal region defines a second trench sidewall opposing the first trench sidewall;
depositing an organic spacer layer on the first trench sidewall, the second trench sidewall, and on top surfaces of the first metal region and the second metal region, while a trench bottom surface that interposes the first and second trench sidewalls remains substantially free of the organic spacer layer, the organic spacer layer including a self-assembled monolayer (SAM);
after the depositing the organic spacer layer, and while the organic spacer layer remains on the top surfaces of the first metal region and the second metal region, forming an inter-metal dielectric (IMD) layer within the trench and over the trench bottom surface; and
after the forming the IMD layer, etching the organic spacer layer to form a first air gap separating the first trench sidewall from the IMD layer and a second air gap separating the second trench sidewall from the IMD layer.

10. The method of claim 9, further comprising:
prior to forming the IMD layer, soaking the semiconductor device in a catalyst precursor to form a catalyst layer on the trench bottom surface; and
after the forming the catalyst layer, forming the IMD layer within the trench and over the catalyst layer.

11. The method of claim 10, wherein the catalyst precursor includes trimethylaluminium (TMA), and wherein the catalyst layer includes a TMA layer.

12. The method of claim 9, wherein the SAM includes a functional group that causes the organic spacer layer to be selectively deposited on the first trench sidewall, the second trench sidewall, and on the top surfaces of the first metal region and the second metal region.

13. The method of claim 12, wherein the functional group includes phosphonic acid, organosulfurs, hydroxide, or thiols.

14. The method of claim 9, wherein the forming the IMD layer includes forming the IMD layer using an atomic layer deposition (ALD) process.

15. The method of claim 9, wherein the etching the organic spacer layer includes etching the organic spacer layer using an $NH_3$ plasma treatment or an $H_2$ plasma treatment.

16. A method, comprising:
providing a patterned metal interconnect layer including a trench;
forming a barrier layer on metal sidewall surfaces of the trench and on top metal surfaces of the patterned metal interconnect layer;
after forming the barrier layer, forming a catalyst layer along a bottom surface of the trench, wherein the catalyst layer is prevented from forming on surfaces of the barrier layer disposed on the metal sidewall surfaces of the trench and on the top metal surfaces of the patterned metal interconnect layer;
after forming the catalyst layer, and while the barrier layer remains on the top metal surfaces of the patterned metal interconnect layer, depositing a dielectric layer over the catalyst layer and interposing the barrier layer on the metal sidewall surfaces of the trench, wherein a top portion of the dielectric layer includes a hump that extends above the top metal surfaces of the patterned metal interconnect layer; and
after depositing the dielectric layer, removing the barrier layer to form air gaps between the dielectric layer and each of the metal sidewall surfaces.

17. The method of claim 16, wherein the catalyst layer includes a layer of trimethylaluminium (TMA).

18. The method of claim 16, wherein the barrier layer includes a self-assembled monolayer (SAM) or a polymer layer.

19. The method of claim 1, wherein prior to removing the selectively deposited barrier layer, a top portion of the dielectric layer within the one or more trenches includes a hump that extends above the top metal surfaces of the patterned metal layer.

20. The method of claim 9, wherein the first metal region electrically contacts a metal via disposed over the first metal region, and wherein the first metal region and the metal via collectively form an hourglass shape.

* * * * *